United States Patent [19]
Shimizu et al.

[11] Patent Number: 5,436,176
[45] Date of Patent: Jul. 25, 1995

[54] METHOD FOR FABRICATING A SEMICONDUCTOR DEVICE BY HIGH ENERGY ION IMPLANTATION WHILE MINIMIZING DAMAGE WITHIN THE SEMICONDUCTOR SUBSTRATE

[75] Inventors: Norisato Shimizu, Moriguchi; Bunji Mizuno, Ikoma; Shuichi Kameyama, Itami, all of Japan

[73] Assignee: Matsushita Electric Industrial Co., Ltd., Osaka, Japan

[21] Appl. No.: 821,647

[22] Filed: Jan. 16, 1992

Related U.S. Application Data

[63] Continuation of Ser. No. 673,330, Mar. 22, 1991, abandoned.

[30] Foreign Application Priority Data

Mar. 27, 1990 [JP] Japan ................................ 2-77862
Jul. 10, 1990 [JP] Japan ............................... 2-181905

[51] Int. Cl.⁶ ................................................ H01L 21/22
[52] U.S. Cl. ........................................ 437/27; 437/24; 437/26; 437/30; 437/31; 437/32; 437/34
[58] Field of Search ............... 437/24, 30, 31, 32, 437/34, 26, 27

[56] References Cited

U.S. PATENT DOCUMENTS

| 3,897,276 | 7/1975 | Kondo ................................ 437/30 |
| 4,045,251 | 8/1977 | Graul et al. ........................ 437/30 |
| 4,369,072 | 1/1983 | Bakeman, Jr. et al. ............. 437/30 |
| 4,584,026 | 4/1986 | Wu et al. ...................... 148/DIG. 24 |
| 4,975,126 | 12/1990 | Margail et al. .................... 437/25 |
| 4,996,164 | 2/1991 | Habitz et al. ....................... 437/30 |

FOREIGN PATENT DOCUMENTS

| 64-72523 | 3/1989 | Japan .................................... 437/30 |
| 1-128521 | 5/1989 | Japan .................................... 437/30 |
| 2-12912 | 1/1990 | Japan .................................... 437/30 |
| 3-278430 | 12/1991 | Japan .................................... 437/30 |

Primary Examiner—Robert Kunemund
Attorney, Agent, or Firm—Ratner & Prestia

[57] ABSTRACT

A semiconductor device having superior electrical characteristics is fabricated. 50 nm of the surface of a CZ (100) silicon substrate is oxidized to form an oxidized film. Afterwards a first ion implantation of boron ions is conducted to this silicon substrate amounting to $7 \times 10^{13}$ cm$^{-2}$ with acceleration energy of 1.5 MeV. Next, a first annealing in nitrogen ambient at 1050° C. for 40 minutes is conducted. Through this ion implantation process a damaged layer and a dopant layer are formed within the silicon substrate. Boron ions are implanted as a second ion implantation, with a dosage of $7 \times 10^{13}$ cm$^{-2}$, followed by a second implanted annealing in nitrogen ambient at 1050° C. for 40 minutes. Further, as a third ion implantation, boron ions are implanted with a dosage of $6 \times 10^{13}$ cm$^{-2}$ followed by a third annealing in nitrogen ambient at 1050° C. for 40 minutes. In the dopant layer thus formed, through a plurality of repeated high energy ion implantation and subsequent annealing, in order to obtain the desired dopant concentration, density of secondary defect occurrences may be lowered.

11 Claims, 13 Drawing Sheets

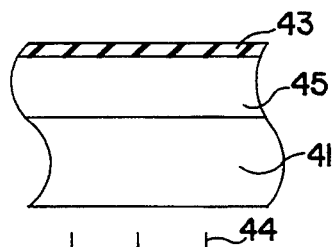
FIG. 4(a)
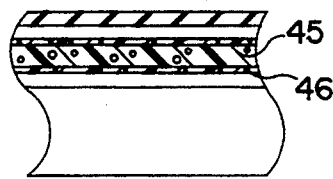
FIG. 4(b)
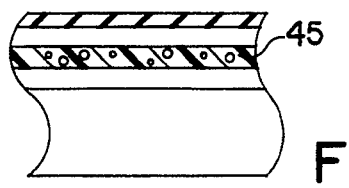
FIG. 4(c)
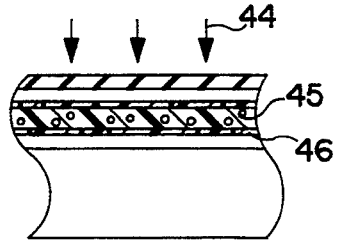
FIG. 4(d)
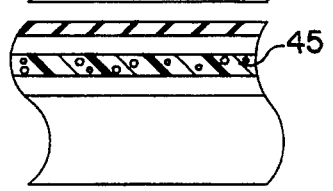
FIG. 4(e)
FIG. 4(f)
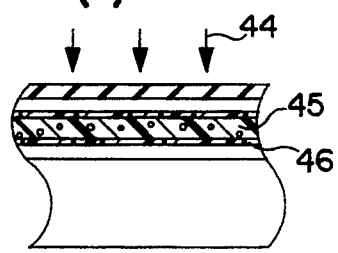
FIG. 4(g)
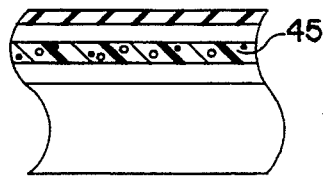
FIG. 4(h)
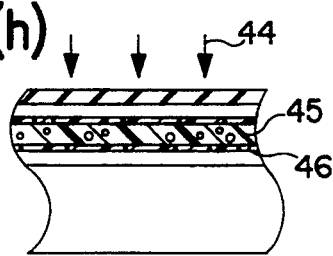
FIG. 4(i)
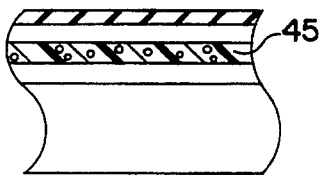

METHOD FOR FABRICATING A SEMICONDUCTOR DEVICE BY HIGH ENERGY ION IMPLANTATION WHILE MINIMIZING DAMAGE WITHIN THE SEMICONDUCTOR SUBSTRATE

This application is a continuation of application Ser. No. 07/673,330 filed Mar. 22, 1991, now abandoned.

The subject invention relates to a method of fabricating a semiconductor device wherein a dopant layer is formed without creating defects deep within the semiconductor substrate.

BACKGROUND OF THE INVENTION

In recent years, methods of using high energy ion implantation to create high concentration dopant regions deep within silicon semiconductor substrates have come into use. In such cases since secondary defect are created by ion implantation, beyond a certain threshold value of dopant concentration from ion implantation, it is difficult to achieve complete restoration of crystallinity even by annealing to restore the implantation damage. As an example of defects arising from high energy ion implantation, see Extended Abstracts of the 20th Conference on Solid State Devices and Materials, Tokyo, p 97–100 (1988).

FIG. 7 shows a prior art method of fabricating semiconductor devices using the ion implantation method. In FIG. 7(a), oxide film 72 is formed above CZ silicon substrate 71. Following this, in FIG. 7(b), dopant layer 75 is formed within silicon substrate 71 by ion beam 73 (Baron ion implantation). In this case, at roughly the same position as the dopant layer 75, a layer 74 damaged by ion implantation is formed, and at the surface and at the substrate sides undamaged fully crystalline layers 76 and 77 are formed.

The profile of the dopant atoms of this dopant layer 75 is a near Gaussian distribution having the peak concentration of dopant atoms at a depth position roughly at the center of the dopant layer 75. In other words, the dopant profile immediately following implantation is centered about its peak concentration with roughly symmetrical dopant profile tails in the depth direction (up and down). Similarly, there are also dopant profile tails following a certain distribution in the horizontal direction (front, back, left and right).

At the tips of these tails, normally, for example, a point where this conforms to the dopant concentration of the background semiconductor substrate is selected for the sake of convenience; a representative dopant concentration of the background is $1 \times 10^{15}$ to $1 \times 10^{16}$ cm$^{-3}$.

Moreover, in FIG. 7(c), the said substrate 71 is subjected to annealing for the purpose of activating the implanted dopant and to recover the implantation damage. Through this annealing, the implantation damage within the substrate crystals become fully crystallized bidirectionally from the surface fully crystalline layer 76 and the substrate fully crystalline layer 77. At this time, the dopant profile following annealing has its peak concentration decreased due to diffusion and the tails of the dopant are spread up and down in the depth direction (similarly front, back, left and right horizontally).

Nevertheless, during the said annealing process, the deformation from the damage caused by implantation exceeding a certain amount of ion implantation (for example a dosage around $1 \times 10^{14}$ cm$^{-2}$) will cause a secondary defect 78 enclosed within the dopant layer 75 even after the annealing. The extreme difficulty of achieving restoration of the implantation induced secondary defect 78, once it is formed, is a known matter.

In clearly explaining such matters, the definitions of terms used for high energy implantation as used in the subject invention will be defined as follows: high energy implantation is that form of ion implantation wherein the peak of dopant concentration in the dopant layer formed by ion implantation to a monocrystalline semiconductor substrate, containing a damaged layer, is located within the semiconductor substrate, and where after the usual annealing (diffusion) the tails of this dopant layer (surface side of the semiconductor substrate) form a dopant layer profile which does not reach the surface of the semiconductor substrate. Or, even if this tail had reached the surface of the substrate, if the dopant concentration of the dopant layer's tail at the semiconductor substrate surface was, for instance, no more than around 20% of the substrate dopant concentration and did not markedly affect the characteristics of the device formed on the substrate surface, it should be considered as an object of the subject invention's high energy ion implantation.

Technically, the definition of high energy ion implantation is ion implantation in an energy region dominated by energy loss of ions due to the inelastic collision (electron energy loss) between implanted ions and electrons, while low energy ion implantation is ion implantation in an energy region dominated by energy loss of ions due to elastic collision (nuclear energy loss) between implanted ions and target atoms comprising the semiconductor. The threshold energy, as used in high energy ion implantation, where the electron energy loss becomes dominant over the nuclear energy loss is a value, for example, in the case of silicon semiconductors of around 17 KeV for boron (B) and 140 KeV for phosphorus (P). However, according to the above mentioned definition of high energy implantation terms, it is usual for the lower limiting values for high energy ion implantation to be more than several times greater than the technically defined threshold value.

Also, as a measure to reduce ion implantation induced secondary defects, ion implantation to silicon semiconductor substrates using FZ substrates had been attempted, and it has been reported that the density of ion implantation secondary defects, believed to be dependent on oxygen within the semiconductor substrate, has been reduced. For example, see Extended Abstracts of the 20th Conference on Solid State Devices and Materials, Tokyo, p. 97–100 (1988).

As related above, when using high energy ion implantation to create deep dopant layers in semiconductor substrates, even if a process of recrystallization through annealing after ion implantation is performed, implantation damage above a certain amount will become remaining deformation and bring about implantation secondary defects.

When using high energy ion implantation to form buried collectors for bipolar devices or well structures for CMOS devices, secondary defects caused by this sort of implantation damage will lead to junction leakage current, etc., and will adversely affect device characteristics.

It is known in prior art that in the so-called SIMOS structure fabrication of oxygen ion implantation of semiconductor substrate for device isolation (dielectric isolation), when forming planar silicon oxide region (dielectric) through the ion implantation of desired oxygen concentration, the generation of secondary crystal defects in the depth direction (up and down) of the single crystal region can be reduced by conducting a plurality of oxygen ion implantation and annealing. For example, see 5th International Workshop of Future Electron Devices—Three Dimensional Integration, Miyagi-Zao, p. 61-67 (1988).

In such a case, it is characteristic that the ion implanted region (oxydized region) loses semiconductivity and becomes a dielectric, and that the main problem is the secondary defects in the single crystal region adjacent to the ion implanted region. In this manner the subject of SIMOX is clearly different from a material standpoint both qualitatively and quantitatively from the subject of this invention which is to control the growth of defects within or peripheral to a semiconductive dopant layer formed by high energy ion implantation.

In SIMOX, it was a premise that in a position greater than a certain depth a planar silicon oxide region (dielectric) is formed continuously, and in principle a tertiary defect in the lateral direction within the non-crystalline oxide (ion implanted region) did not exist so that there was no need to take into consideration the generation of three-dimensional defects.

Nevertheless, unlike the case of SIMOX which unselectively forms planar regions of oxide film which becomes a dielectric, when using the technique of high energy dopant implantation of such as boron (B), phosphorus (P) and arsenic (As) into semiconductor substrate to selectively form devices buried dopant layers, the secondary defects extending in the depth direction (up and down) or planar side direction (left and right) become the cause of leakage current generation so that this is an important subject of study.

SUMMARY OF THE INVENTION

As related above, when high energy ion implantation and annealing is conducted to form a dopant layer for the purpose of forming a high concentration dopant region deep within a silicon semiconductor substrate, implantation damage is confined within the substrate even with annealing after ion implantation, the deformation from this damage remains, and moreover secondary defect density tends to increase. Due to the existence of such secondary defects, problems such as degradation of electrical characteristics occurred.

Also, defects from high energy ion implantation damage occur largely near the peak dopant concentration site of the desired dopant layer, and, through annealing these defects grow to active regions beyond the dopant layer or to adjoining junctions exhibiting undesired effects such as decreased carrier lifetime in the active region and changes in electrical resistance. In particular, there was the problem that if this secondary defect were to touch the depletion layer of the junction the electrical characteristics of the junction (generation of leak current) would be degraded.

The subject invention was conceived taking into account these points with the goal of offering a method of fabricating a semiconductor device, when dopant layers were formed by high energy ion implantation into a semiconductor substrate, to suppress damages within the semiconductor substrate due to ion implantation, crystal defects, etc.; or, without confinement, eliminating deleterious effects such as electrical degradation of this dopant layer or of adjacent semiconducting regions.

A method of fabricating an exemplary embodiment of the present invention in order to resolve the above related problems, consists of a process of forming via selective high energy ion implantation, a plurality of dopant layers at specified depth and at specified spacing within the semiconductor substrate, and a process of annealing the said semiconductor substrate, characterized by a plurality of repeated selective ion implantation and annealing to obtain the desired dopant concentration for the said plurality of dopant regions.

A method of fabricating a second exemplary embodiment of the present invention in order to resolve the above problems consists of a process to form, at a specified depth within the semiconductor substrate, a first buried dopant layer by conducting a first implantation of dopant by selective high energy ion implantation followed by a first annealing; a process of forming a second buried dopant layer by conducting, to the inside of the said first buried dopant layer profile's tail formed by selective high energy ion implantation, a second implantation of dopant having the same conductivity as the said layer and a second annealing, and forming a united dopant layer from the said first and second buried dopant layers; and, a process of repeating, including the second process, a plurality of times a process similar to the said second dopant implantation and the subsequent second annealing, to form a united main dopant layer having the desired dopant concentration; characterized by the use of the semiconductor region formed by the united main dopant layer as a low resistance buried region.

A method of fabricating a third exemplary embodiment of the present invention in order to resolve the above problems consists of a process to form, at a specified depth within the semiconductor substrate, a first buried dopant layer by conducting a first implantation of dopant by selective high energy ion implantation followed by a first annealing; a process of forming a second buried dopant layer by conducting, to the inside of the said first buried dopant layer profile's tail formed by selective high energy ion implantation, a second implantation of dopant having the same conductivity as the said layer and a second annealing, and forming a united dopant layer from the said first and second buried dopant layers; a process of repeating, including the second process, a plurality of times a process similar to the said second dopant implantation and the subsequent second annealing, to form a united main dopant layer having the desired dopant concentration; and, a process of forming a separate downward dopant layer having a peak dopant concentration to the outside of the downward side of the said united main dopant layer's dopant profile's tail by a separate implantation of a dopant having the same conductivity as the said layer followed by annealing, and, forming a united dopant layer by overlapping this separate dopant layer profile's upward tail and the said united main dopant layer's tail; characterized by surrounding the crystal defects from the united main dopant layer with this separate dopant layer, and using the dopant layer united by overlapping the tails as a low resistance buried region.

A method of fabricating a fourth exemplary embodiment of the present invention in order to resolve the above problems consists of a process to form, at a specified depth within the semiconductor substrate, a first buried dopant layer by conducting a first implantation of dopant by selective high energy ion implantation followed by a first annealing; a process of forming a second buried dopant layer by conducting, to the inside of the said first buried dopant layer profile's tail formed by selective high energy ion implantation, a second implantation of dopant having the same conductivity as the said layer and a second annealing, and forming a united dopant layer from the said first and second buried dopant layers; a process of repeating, including the second process, a plurality of times, a process similar to the second dopant implantation and the subsequent second annealing, to form a united main dopant layer having the desired dopant concentration; and, a process of forming a separate upward dopant layer having a peak dopant concentration to the outside of the upward side of the said united main dopant layer's dopant profile's tail by a separate implantation of a dopant having the same conductivity as the said layer followed by annealing, and, forming a united dopant layer by overlapping this separate dopant layer profile's downward tail and the said united main dopant layer's upward tail; characterized by surrounding the crystal defects from the united main dopant layer with this separate dopant layer, and using the dopant layer united by overlapping the tails as a low resistance buried region.

A method of fabricating a fifth exemplary embodiment of the present invention in order to resolve the above problems consists of a process to form, at a specific depth within the semiconductor substrate, a first buried dopant layer by conducting a first implantation of dopant by selective high energy ion implantation followed by a first annealing; a process of forming a second buried dopant layer by conducting, to the inside of the said first buried dopant layer profile's tail formed by selective high energy ion implantation, a second implantation of dopant having the same conductivity as the said layer and a second annealing, and forming a united dopant layer from the said first and second buried dopant layers; a process of repeating, including the second process, a plurality of times a process similar to the said second dopant implantation and the subsequent second annealing, to form a united main dopant layer having the desired dopant concentration; and, a process of forming a separate dopant layer having a peak dopant concentration to the outside of the plane of the said united main dopant layer's dopant profile's tail by a separate implantation of a dopant having the same conductivity as the said layer followed by annealing, and forming a united dopant layer by having this separate dopant layer's profile surround the tails of the said united main dopant layer; characterized by surrounding the crystal defects from the united main dopant layer with this separate dopant layer, and using the united dopant layer as a low resistance buried region.

A further exemplary embodiment of the present invention is characterized by the addition of a process to reduce the oxygen content of the substrate at depths shallower than a specified depth, prior to the plurality of ion implantation and annealing.

In accordance with the first and second exemplary embodiments of the present invention it is possible to reduce the density of secondary defects within dopant layers formed by a plurality of ion implantation and subsequent annealing for the purpose of obtaining a desired dopant concentration. For example, if the dosage of the first high energy ion implantation into a silicon semiconductor substrate is $1 \times 10^{14}$ cm$^{-2}$ or less, while there will be a region of concentrated implantation damage in the vicinity of the dopant's peak concentration point located roughly at the center of the implanted dopant layer, crystallinity will be recovered by recrystallization from post-implantation annealing. Under such a condition of restored crystallinity, even if high energy ion implantation with dosage of no more than $1 \times 10^{14}$ cm$^{-2}$ followed by annealing is repeated (or repeated several times) the occurrence of crystal defects within the main dopant layer will be reduced. In the prior art methods when a buried dopant layer was formed using a single high energy ion implantation greater than $1 \times 10^{14}$ cm$^{-2}$, unrestorable secondary defects were formed. In a process such as that of the subject invention a main dopant layer which becomes a buried low resistance region containing sufficiently greater dopant than $1 \times 10^{14}$ cm$^{-2}$ can be formed.

In accordance with the third, fourth and fifth exemplary embodiments of the present invention there are times when damage of crystallinity is not completely removed; for example in the inside of a main dopant layer's profile, formed by high energy ion implantation to semiconductor substrates such as silicon dosage greater than $1 \times 10^{14}$ cm$^{-2}$ followed by annealing, repeated a plurality of times, and secondary defects occur to a certain degree, reaching to the vicinity of the main dopant layer profile's tail or to the outside of same.

In case a PN junction is formed in the vicinity of or the outside of this main dopant layer profile's tail (above, below, front, back, left and right of the dopant layer), the electrical characteristics of this junction can be degraded, and leakage current can occur. In particular, when the PN junction is reverse biased and a voltage is applied to it, the depletion layer of this PN junction will extend within the main dopant layer profile's tail so that it is easy for a large leakage current to occur. By combining high energy ion implantation at dosage equal to or less than $1 \times 10^{14}$ cm$^{-2}$ with high energy ion implantation having a peak concentration to the outside of the main dopant layer's profile and subsequent annealing to form a separate dopant layer, making the tails of this separate dopant layer and the main dopant layer overlap to create a new united dopant layer, it is possible to prevent the depletion layer of a PN junction formed in the vicinity of the outside of this separate dopant layer from extending into the main dopant layer profile's tail. Through this, from the existence of a separate dopant layer, the generation of large leakage current in the PN junction can be suppressed.

If necessary, the high energy ion implantation which forms the separate dopant layer can be repeated a plurality of times. A plurality of ion implantations is an effective step to lower the resistance of the separate dopant layer, and also has the benefit that since the dopant concentration is increased, the suppression of depletion layer incursion is facilitated.

In accordance with a further exemplary embodiment of the present invention by adding a process of decreasing the oxygen concentration in the substrate at depths shallower than a specified depth prior to the process of plural ion implantation and annealing, it is possible to suppress the growth of secondary defects within the dopant layer formed by a repetition of plurality of high energy ion implantation and subsequent annealing to obtain the desired dopant concentration. For instance, prior to undertaking high energy ion implantation to a CZ silicon substrate, by adding a process of reducing the oxygen concentration within the silicon substrate to $4 \times 10^{17}$ cm$^{-3}$ or less, and followed by a single high energy ion implantation with a dosage of $1 \times 10^{14}$ cm$^{-2}$ or less, the implantation damage is restored by annealing. By further repeating the process of ion implantation and annealing, the desired dopant concentration is obtained. When a dopant layer is formed using the above method, it is possible to suppress the growth of implantation induced secondary defects, and adverse effects to adjoining dopant regions such as occurrence of leakage currents can be suppressed.

Process cross-sections of the method for fabricating a semiconductor device in a first embodiment of the subject invention.

Figure 2A:
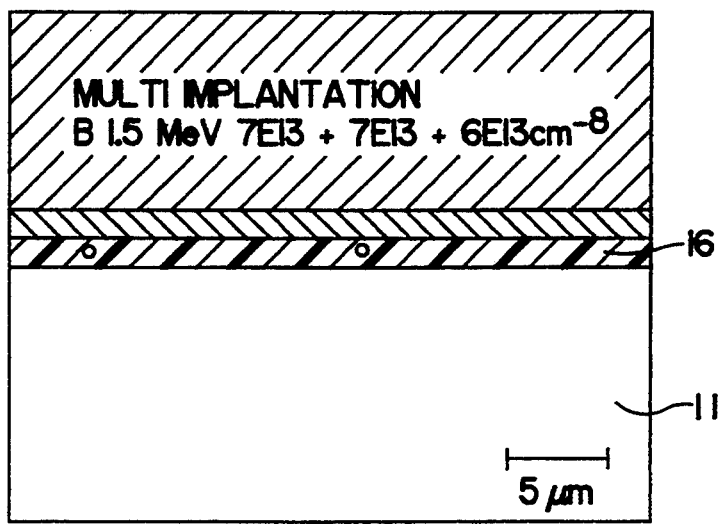
Figure 2B:
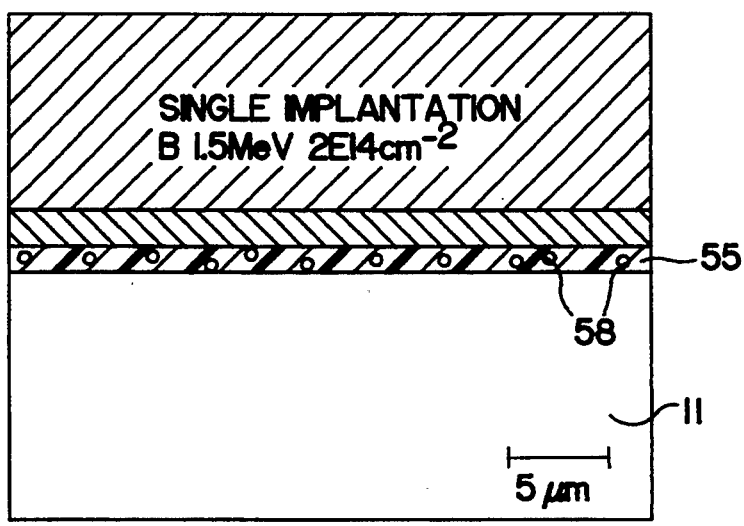

FIG. 2(a)–FIG. 2(b)

Typical figures of implantation secondary defect occurrence according to the subject invention and the prior art.

Figure 3A:
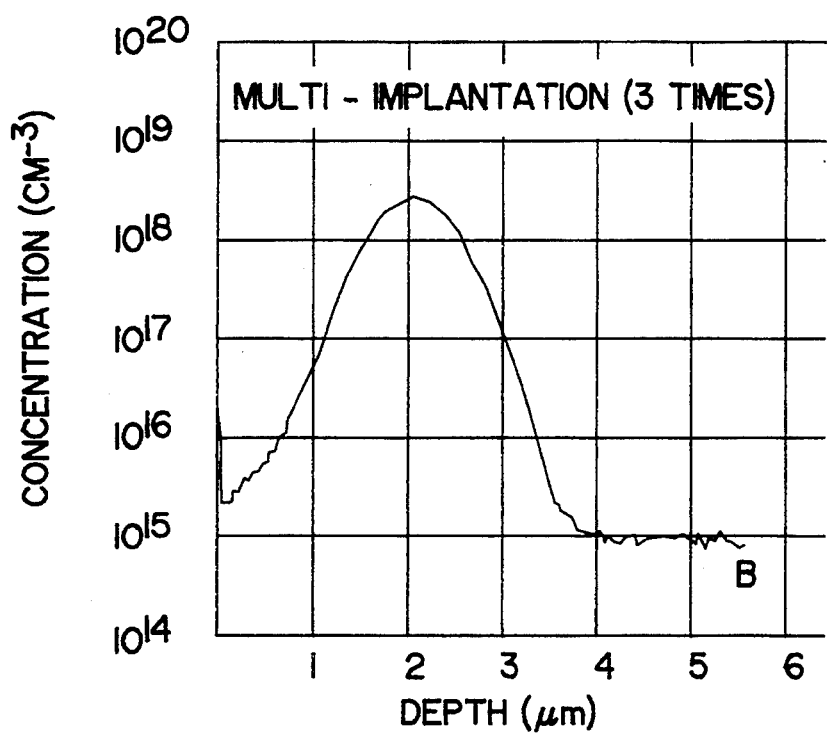
Figure 3B:
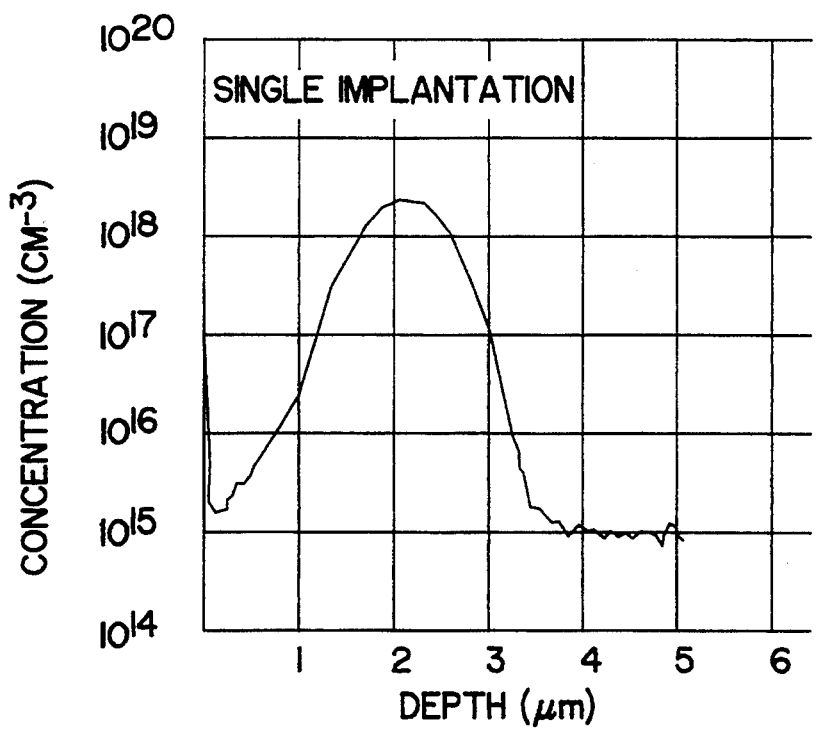

FIG. 3(a)–FIG. 3(b)

Figures of boron concentration in the depth direction, through introduction of boron dopant with the subject invention and the prior art technology.

FIG. 4(a)–FIG. 4(i)

Process cross-sections of the method for fabricating a semiconductor device in the second embodiment of the subject invention.

Figure 5A:
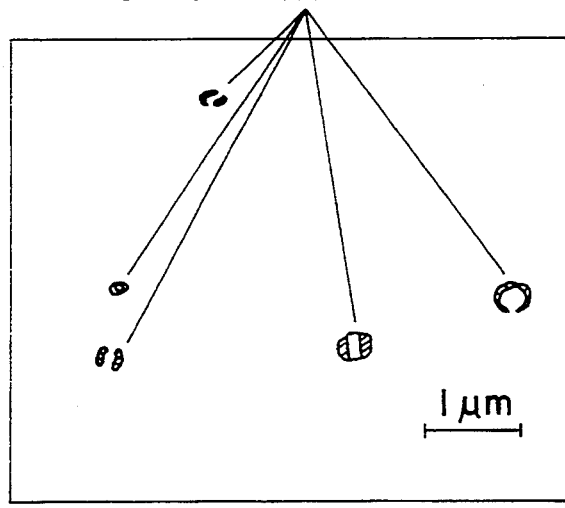
Figure 5B:
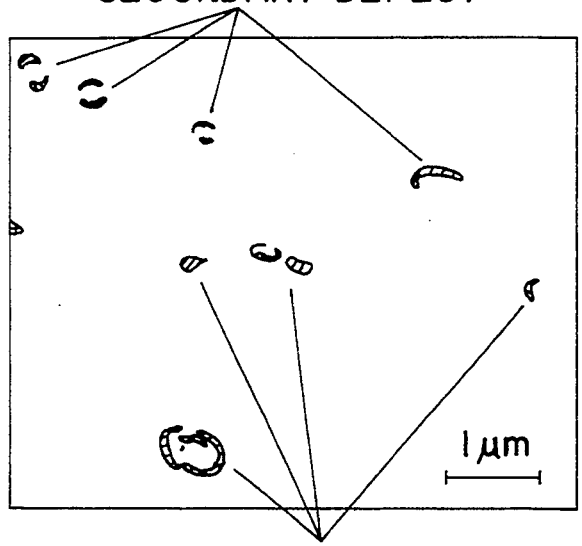
Figure 5C:
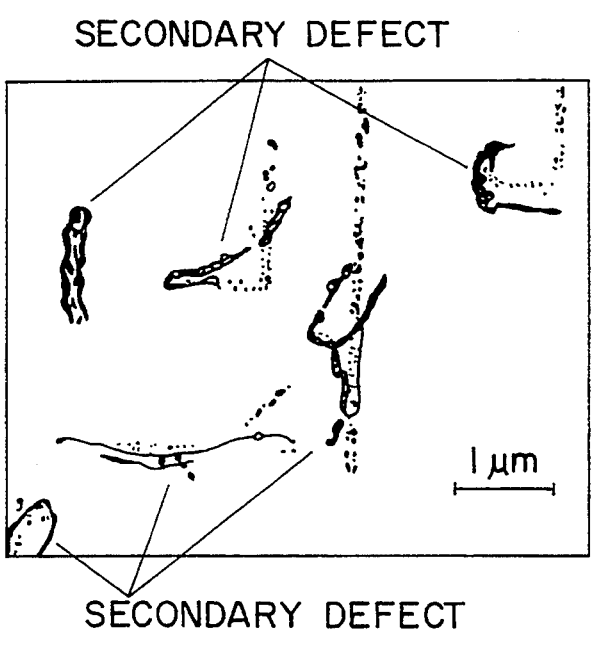

FIG. 5(a)–FIG. 5(c)

Planar figures showing the implantation secondary defects when boron dopant was introduced in accordance with a second embodiment of the subject invention and the prior art.

FIG. 6

Figure showing the growth of implantation secondary defect when boron dopant was introduced in accordance with the subject invention.

Figure 7A:
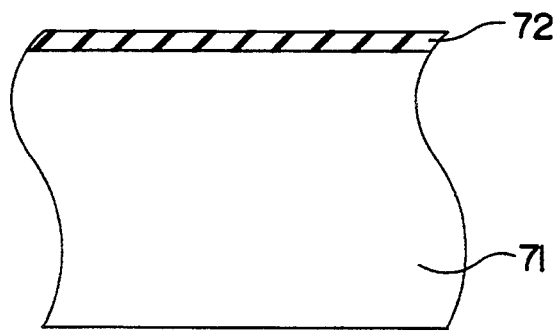
Figure 7B:
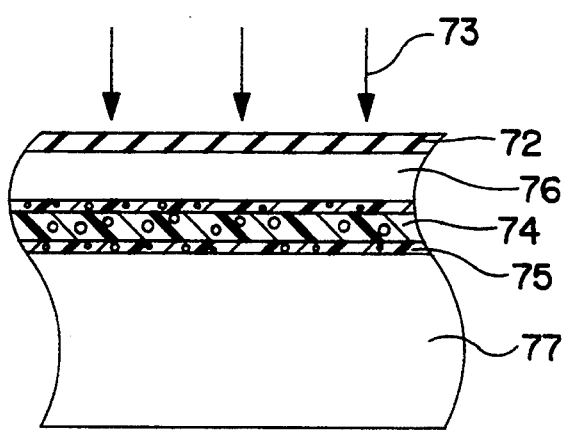
Figure 7C:
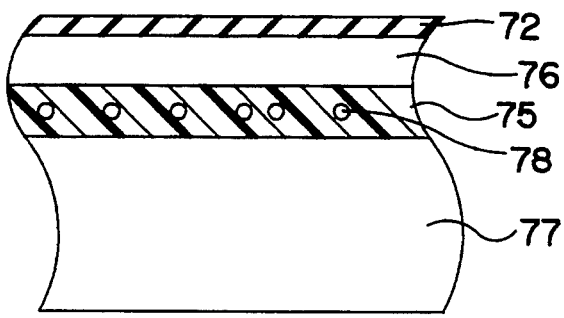

FIG. 7(a)–FIG. 7(c)

Process cross-section of method of fabricating a semiconductor device when dopant was introduced using prior art.

Figure 8A:
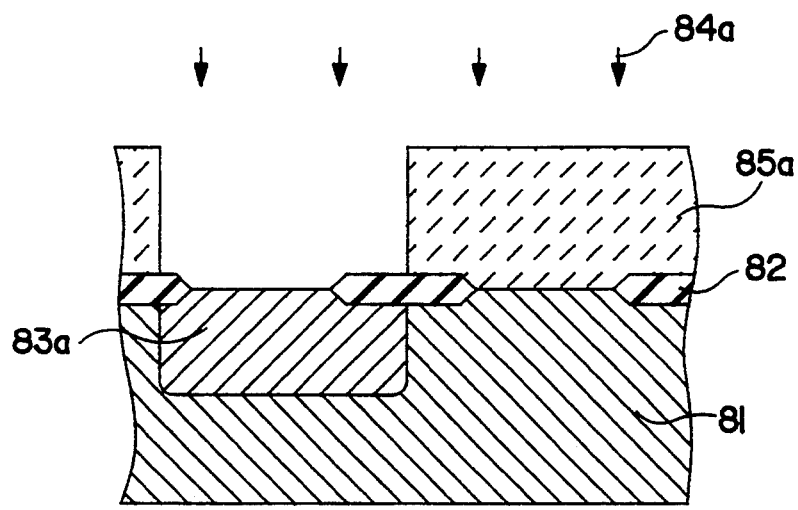
Figure 8B:
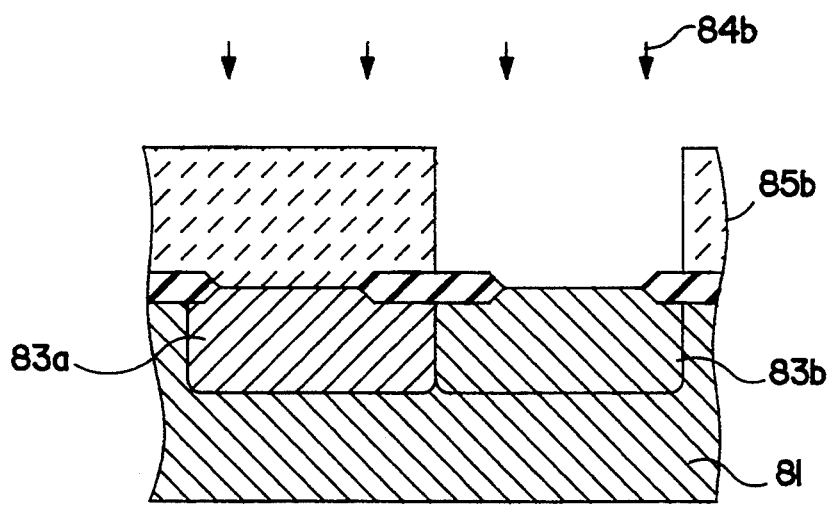
Figure 8C:
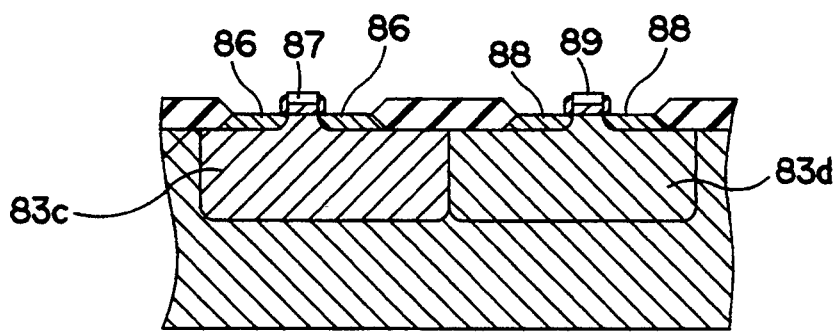

FIG. 8(a)–FIG. 8(c)

Process cross-section when a well of a CMOS device was formed in accordance with the subject invention.

Figure 9A:
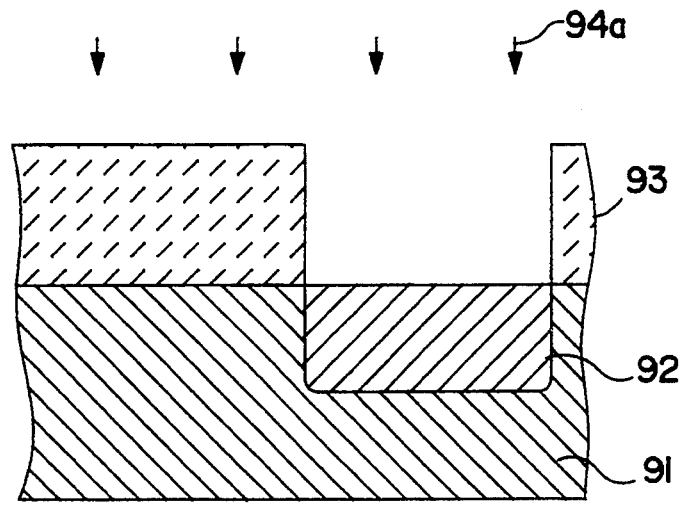
Figure 9B:
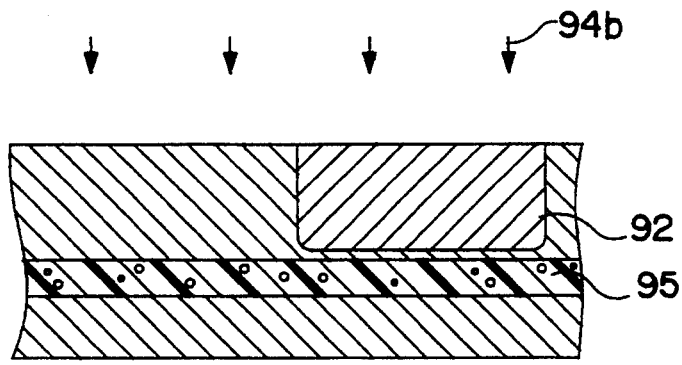
Figure 9C:
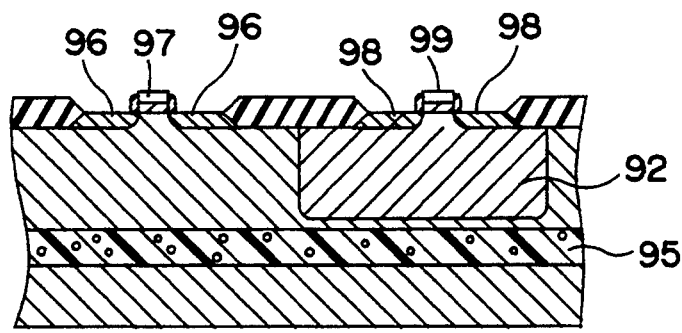

FIG. 9(a)–FIG. 9(c)

Process cross-section when high concentration buried dopant layer was formed in a CMOS device in accordance with the subject invention.

FIG. 10(a)–FIG. 10(d)

Process cross-section when the subject invention's fabrication method was applied to the fabrication method for a bipolar vertical NPN transistor.

FIG. 11(a)–FIG. 11(d)

Process cross-section when the subject invention's fabrication method was applied to the fabrication method for a bipolar vertical NPN transistor.

FIG. 12(a)–FIG. 12(d)

Process cross-section when the subject invention's fabrication method was applied to the fabrication method for a bipolar vertical NPN transistor.

DESCRIPTION OF THE PREFERRED EMBODIMENTS

Embodiment 1

FIG. 1 is the process cross-section showing a method of fabricating a semiconductor device in accordance with the first embodiment of the subject invention. FIG. 1 will be used to explain the method of fabricating a semiconductor device in the subject embodiment.

Figure 1A:
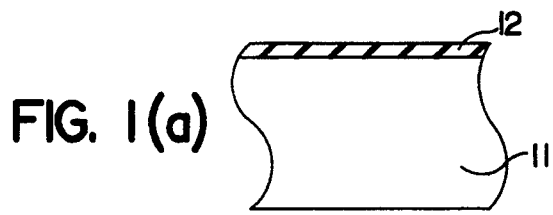
FIG. 1(a)–FIG. 1(g)

In FIG. 1(a), 50nm of the CZ(100) silicon substrate 11 is oxidized to form the oxide film 12.

Figure 1B:
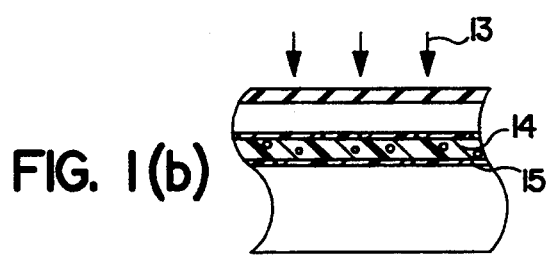

In FIG. 1(b), as the first ion implantation to this silicon substrate 11, boron ions 13 are implanted at a dosage of $7 \times 10^{13}$ cm$^{-2}$ and acceleration energy of 1.5 MeV, and a first annealing in nitrogen ambient at 1050° C. for 40 minutes is done. By this ion implantation process a damaged layer 14 and a dopant layer 15 are formed within the silicon substrate 11.

Figure 1C:
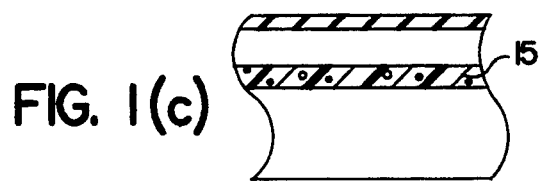

In FIG. 1(c), the damage within the silicon substrate is restored by the first annealing process.

Figure 1D:
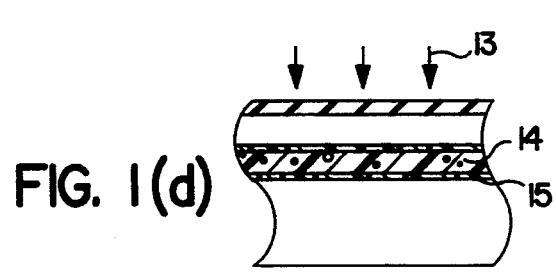
Figure 1E:
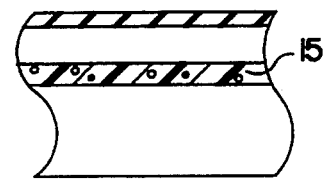

Subsequently, as a second ion implantation boron ions 13 are implanted with a dosage of $7 \times 10^{13}$ cm$^{-2}$ (FIG. 1(d)), following which a second annealing in nitrogen ambient at 1050° C. for 40 minutes (FIG. 1 (e)) is undertaken.

Figure 1F:
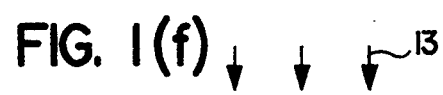
Figure 1G:
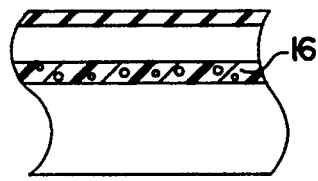

Once again, as a third ion implantation boron ions 13 are implanted with a dosage of $6 \times 10^{13}$ cm$^{-2}$ (FIG. 1(f)), and a third annealing in nitrogen ambient at 1050° C. for 40 minutes (FIG. 1(g)) is undertaken.

The amount of dosage and annealing obtained by these three steps of ion implantation and annealing is $2 \times 10^{14}$ cm$^{-2}$ and 2 hours at 1050° C. Through these three steps of ion implanting and annealing processes, a dopant layer 16 having the desired concentration is formed in silicon substrate 11.

FIGS. 2(a) and 2(b) are typical figures showing, respectively, the implantation secondary defects when the desired dopant was introduced in accordance with the subject invention's above noted embodiment and in accordance with prior art.

Implantation secondary defects were observed using observation of the silicon substrate's cross-section etch pits. In the prior art, many occurrences of implantation secondary defects 58 can be noted within dopant layer 55. It can be seen that, in comparison to the case where dopant was introduced in accordance with prior art, etch pit density is considerably lower with the subject invention.

FIGS. 3(a) and 3(b) are figures showing the depth direction boron concentration profile using SIMS (Secondary Ion Mass Analysis Apparatus) to measure boron's depth direction concentration distribution, when boron dopant was introduced by ion implantation using the subject invention and prior art technology, respectively. We can see that there is no difference in the depth direction concentration distribution even through conducting a plurality of implantations and annealings.

Embodiment 2

FIG. 4 is a typical figure of an embodiment of the method of fabricating a semiconductor device, when the process of decreasing the substrate oxygen concentration in a region shallower than a specified depth of the substrate is added prior to the plurality of ion implantation and annealing according to an exemplary embodiment of the subject invention.

In FIG. 4(a), annealing is used to diffuse out of the substrate surface the oxygen contained in the surface of the CZ (100) silicon substrate 41 having an initial substrate oxygen concentration of $1.6 \times 10^{18}$ cm$^{-2}$ or greater. In this manner a surface low oxygen concentration region 42 is formed on the surface of the silicon substrate 41. As a representative annealing, annealing was conducted at 1100° C. for 5 hours (in dry oxygen) plus 1000° C. for 9 hours (in dry oxygen.) The surface low oxygen concentration region 42 using these annealing conditions, that is to say the region with substrate oxygen concentration is $4 \times 10^{17}$ cm$^{-3}$ or less, had a depth of approximately 6 nm from the silicon substrate surface. Thereafter, 50 nm of the silicon substrate surface is oxidized to form an oxide film 43.

In FIG. 4(b), as the first ion implantation to this silicon substrate, boron ions 44 are implanted to a dosage of just $5 \times 10^{13}$ cm$^{-2}$. By this ion implantation process a dopant layer 45 and a damaged layer 46 are formed within the silicon substrate.

In FIG. 4(c), as the first annealing process annealing is conducted in nitrogen ambient at 1050° C. for 30 minutes. By this first annealing process, the damage within the silicon substrate is restored.

In FIGS. 4(d) and (e), as the second ion implantation boron ions 44 are implanted with a dosage of just $5 \times 10^{13}$ cm$^{-2}$. Following this as the second annealing, annealing is conducted in nitrogen ambient at 1050° C. for 30 minutes.

In FIGS. 4(f) and (g), as the third ion implantation boron ions 44 are implanted with a dosage of $5 \times 10^{13}$ cm$^{-2}$ and the third annealing is conducted in nitrogen ambient at 1050° C. for 30 minutes.

In FIGS. 4(h) and (i), as a further fourth ion implantation boron ions 44 are implanted with a dosage of $5 \times 10^{13}$ cm$^{-2}$ and a fourth annealing is conducted in nitrogen ambient at 1050° C. for 30 minutes.

The total dosage and annealing obtained by these four steps of ion implantation and annealing are $2 \times 10^{14}$ cm$^{-2}$ and 1050° C. for 2 hours via these four steps of implantation and annealing a dopant layer with the desired concentration is formed within the silicon substrate.

FIG. 5(a) is a planar figure of implantation induced secondary defects in a further embodiment of the subject invention. FIG. 5(b) shows the case where annealing was done to reduce the substrate oxygen concentration of the region to which dopant is to be introduced by energy ion implantation to a concentration of $4 \times 10^{17}$ cm$^{-3}$ or less and the ion implantation was undertaken by a single ion implantation and annealing instead of dividing it into four stages to introduce the desired dopant. FIG. 5(c) is the planar figure showing the implantation induced secondary defects from undertaking four ion implantations and annealings to obtain the desired dopant concentration without reducing the substrate oxygen concentration of the dopant introduction region. This planar figure was obtained by plan-view TEM observation.

In this manner it was confirmed through plan-view TEM micrograph that it was possible to reduce the implantation secondary defect density by using the method of adding the process of reducing the oxygen concentration within the substrate at depths shallower than the specified depth, before repeating a plurality of ion implantation and annealing processes of the subject embodiment.

Figure 6:
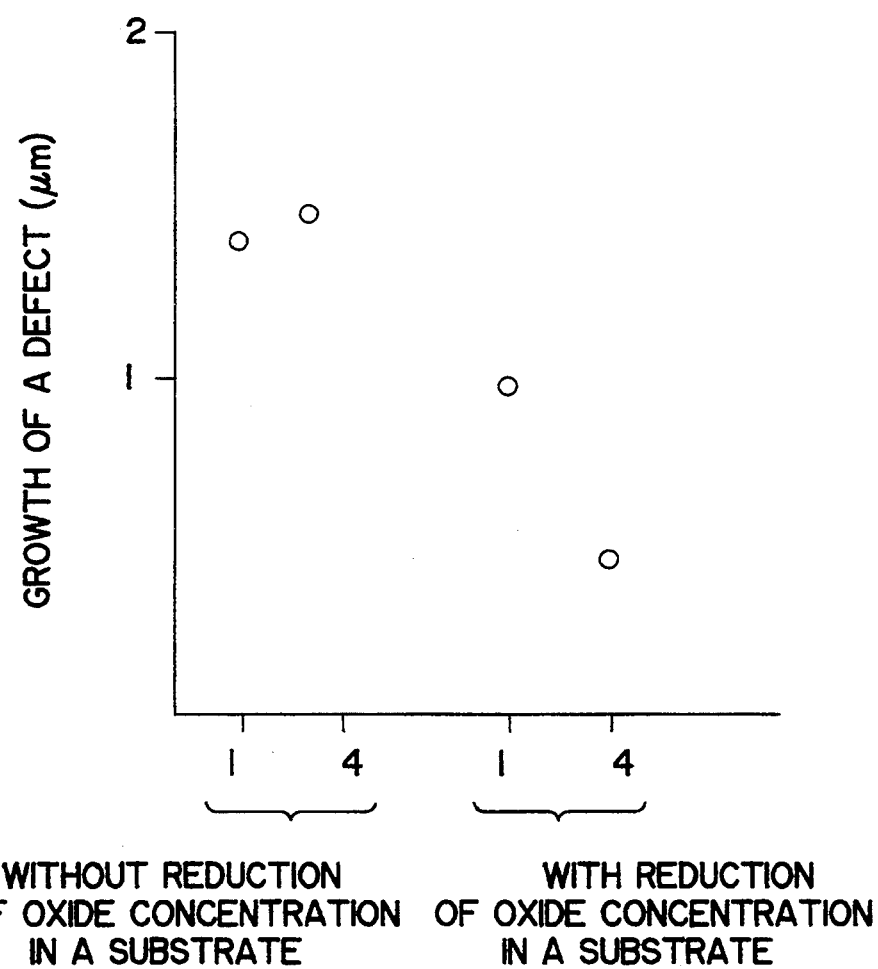

FIG. 6 shows the growth of secondary defects when ion implantation of boron at high energy (implantation energy 1.5 MeV and total dosage $2 \times 10^{14}$ cm$^{-2}$) was undertaken and the post-implantation annealing was at temperature of 1050° C. for total annealing time of 2 hours.

When the decreasing of substrate oxygen concentration was not undertaken, it is possible to reduce the density of implantation secondary defects if a plurality of repeated ion implantation and annealing are undertaken to obtain the desired dopant concentration (see Embodiment 1), but even repeating the ion implantation and annealing process four times showed no effects on the growth of secondary defects. On the other hand, if reduction of the substrate oxygen concentration was undertaken, even if the ion implantation was not split into four stages, it is possible not only to reduce the density of defects but to reduce the growth of defects. If the implantation is divided into four stages, extension of defects is even further suppressed.

While in the subject embodiment the implantation dosage prior to each annealing was set to $7 \times 10^{13}$ cm$^{-2}$ or $6 \times 10^{13}$ cm$^{-2}$ or $5 \times 10^{13}$ cm$^{-2}$, as long as the total dosage per single annealing does not exceed $1 \times 10^{14}$ cm$^{-2}$ a plurality of ion implantations may be undertaken per single annealing. Moreover, while in the subject embodiment the silicon substrate surface was oxidized, the explanation was made using boron as the dopant even when the oxidization process was omitted; yet it goes without saying that the same results would be obtained with other dopants such as phosphorus, arsenic, antimony, etc.

Also, in the subject embodiment, in order to reduce the oxygen concentration in the substrate at depth shallower than the specified depth a two-stage annealing at 1100° C. for 5 hours (in dry oxygen) plus 1000° C. for 9 hours (in dry oxygen) to diffuse oxygen outward from the substrate surface and reduce the oxygen concentration within the substrate. However, as a first annealing, breakout was conducted through low temperature annealing at 800° C. for 2 hours. It goes without saying that similar results can be obtained through a second and a third annealing at 1100° C. for 5 hours and at 1000° C. for 9 hours to diffuse oxygen outward and to grow breakout cores, using the so-called denuded zone formation method, to decrease oxygen concentration within the substrate at depth shallower than a specified depth to $4 \times 10^{17}$ cm$^{-3}$ or less. For instance, this is shown in the Extended Abstracts of the 27th Spring Meeting of the Japanese Society of Applied Physics and Related Societies, 3P-1-15. When these formations of denuded zones are conducted for the purpose of reducing the oxygen concentration in the region of dopant introduction, it is clear that not only is the density of implantation secondary defects reduced, but heavy metal contamination from oxygen breakout materials can also be prevented.

In the subject embodiment a CZ silicon substrate was annealed in order to reduce the substrate oxygen concentration to $4 \times 10^{17}$ cm$^{-3}$ or less, yet it goes without saying that even if silicon substrates having substrate oxygen concentration of $4 \times 10^{17}$ cm$^{-3}$ or less, such as FZ silicon substrate, MCZ silicon substrate and epitaxially grown substrate, were used for a plurality of ion implantations a similar effect of decreased secondary defect density would be obtained. While in the subject embodiment a silicon substrate was used for the semiconductor substrate, it goes without saying that semiconductor substrates such as compound substrates can be used.

Embodiment 3

FIG. 8 shows an application of the first embodiment for forming wells with high energy for preventing latch-up which has become a problem with miniaturization of CMOS devices.

In FIG. 8(a), after forming an oxide film above the silicon substrate 81 for the purpose of separating elements of the device, phosphorus ions 84a are implanted through a mask 85a via high energy implantation (for example, implantation energy of 900 KeV and dosage of $3 \times 10^{12}$ cm$^{-2}$). Through this, N well 83a is formed.

Thereafter, in FIG. 8(b) mask 85b is formed and then via mask 85b high energy implantation (for example with implantation energy of 500 KeV and dosage of $1 \times 10^{13}$ cm$^{-2}$) of boron ions is undertaken. Thus, P well 83b is formed. Then annealing is undertaken (for example at 1050° C. for 40 minutes) to restore the ion implantation damage at the N well 83a and the P well 83b.

Also through the mask high energy phosphorus ion implantation and high energy boron ion implantation are conducted, followed also by post-implantation annealing to repeat the processes in FIG. 8(a) and FIG. 8(b).

Then the processes in FIG. 8(a) and FIG. 8(b) were repeated to conduct the above noted processes of phosphorus ion implantation, boron ion implantation and annealing, and a total of three processes of phosphorus ion implantation, boron ion implantation and annealing were carried out. Through these steps, in the final analysis, well structures were formed having dopant concentrations for phosphorus and boron, respectively, similar to when ions were implanted with dosages of $9 \times 10^{12}$ cm$^{-2}$ and $3 \times 10^{13}$ cm$^{-2}$ and post-implantation annealing was undertaken at 1050° C. for 2 hours.

As the result of this, the formation of retrograde N well 83c, having high dopant concentration deep in the substrate, by introducing N-type dopant via phosphorus ion beam 84a; and, similarly to the phosphorus ion implantation, the formation of retrograde P well 83b via boron ion beam 84b are accomplished (refer to FIG. 8(c).)

Further, in FIG. 8(c), the formation of gate oxide film, gate electrode, source and drain 86 and 88 are done, and by forming N channel and P channel dual transistors 87 and 89, the formation of CMOS structure semiconductor device is accomplished.

When well structures are formed with the above method, it is possible, due to reduction of implantation induced secondary defect density, to reduce the occurrences of lateral secondary defects between the N well and the P well, and also the leakage current accompanying the growth of the defects. Because of this, since in comparison to prior art, the distance between the N well 83c and the P well 83b can be reduced, an even higher order of semiconductor device integration can be achieved. With regard to the up and down directions within the substrate, it is possible to reduce in N channel and P channel transistors, respectively, the occurrences of implantation secondary defects and the leakage current caused by the extent ion of the defects between the N channel transistor 89's source, drain region 88 and P well 83d, and, between the P channel transistor 87's source, drain region 86 and N well 83c.

Embodiment 4

FIG. 9 shows the second embodiment of the subject invention, when a buried dopant layer was formed with high energy in order to prevent latch-up which becomes a problem in the miniaturization of CMOS devices.

In FIG. 9(a), after forming mask 93 above the P-type silicon substrate 91, ion implantation is undertaken with phosphorus ion 94a (for example with implantation energy of 180 KeV and dosage of $5 \times 10^{12}$ cm$^{-2}$). Thereafter, annealing is undertaken for the purpose of activating and diffusing the phosphorus dopant to form N well 92.

After this, in FIG. 9(b), boron ions 94b are implanted through high energy implantation (for example with implantation energy of 2 MeV and dosage of $2.5 \times 10^{13}$ cm$^{-2}$). Annealing is undertaken once again (for example at 1050° C. for 30 minutes) for the purpose of restoring the damage from ion implantation. By further repeating the high energy ion implantation process and the annealing process, a total of four processes of ion implantation and annealing are performed to obtain a high concentration buried dopant layer 95.

Then in FIG. 9(c) gate oxide film, gate electrode and source and drain 96 and 98 are formed, and, a CMOS device is formed by forming N channel and P channel dual transistors 97 and 99.

The semiconductor device formed by the above noted processes is particularly effective in reducing the leakage current from the location of the PN junction and between the N well 92, near the site of defects occurring within the high concentration buried dopant layer 95, and the high concentration buried layer 95.

Embodiment 5

FIGS. 10(a)–(d) will be used to explain the first embodiment which applied the method of the subject invention to the method of fabricating a bipolar vertical NPN transistor.

Figure 10A:
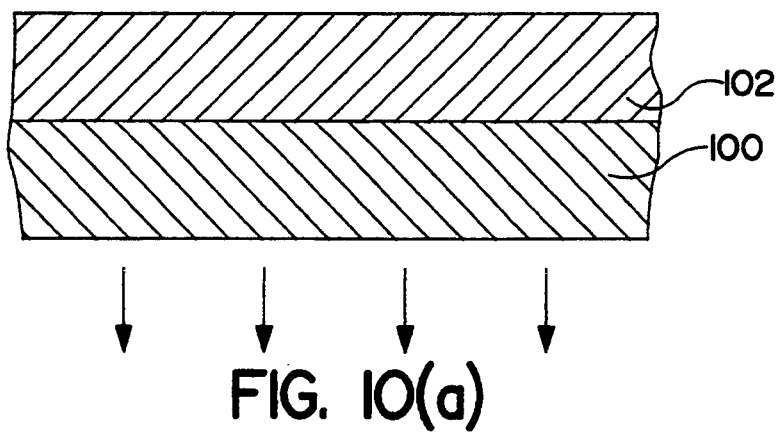

In FIG. 10(a), a well-shaped N-type semiconductor region 102 was formed within a P-type monocrystalline silicon substrate 100, by low energy unselective ion implantation and annealing, over the entire surface intended for bipolar formation.

Figure 10B:
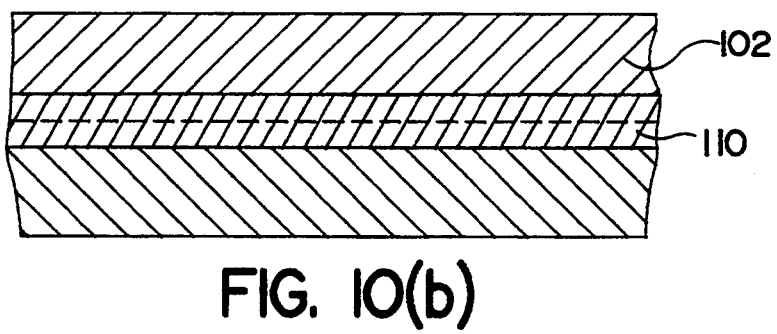

In FIG. 10(b), a first ion implantation of $8 \times 10^{13}$ cm$^{-2}$ of arsenic (As), at a high acceleration energy of 1 MeV, was carried out to form an N-type dopant layer 110, which is to become the buried region, at the boundary of monocrystalline silicon substrate 100 and the N-type semiconductor region 102, a first annealing at approximately 1000° C. for 50 minutes was done; and, as shown in the figure, a first N-type dopant layer 110 was formed. Through this first annealing, the crystal deformation within the N-type dopant layer immediately after the first high energy ion implantation was suppressed and the occurrence of secondary defects was prevented.

Figure 10C:
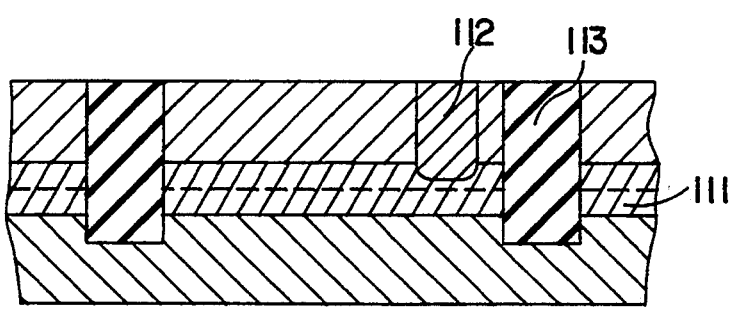
Figure 10D:
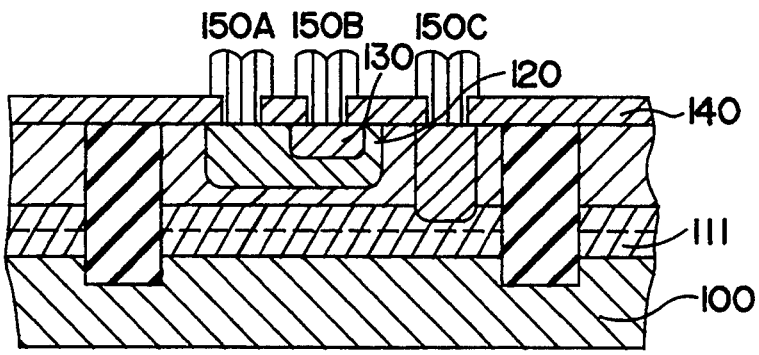
Figure 11A:
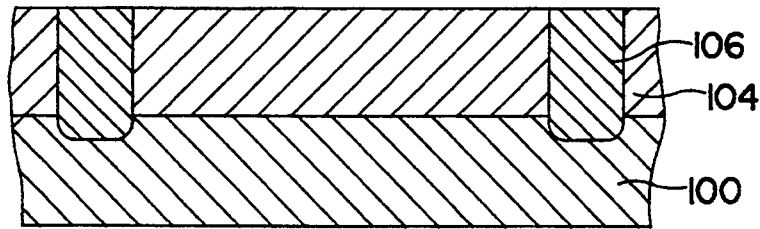
Figure 11B:
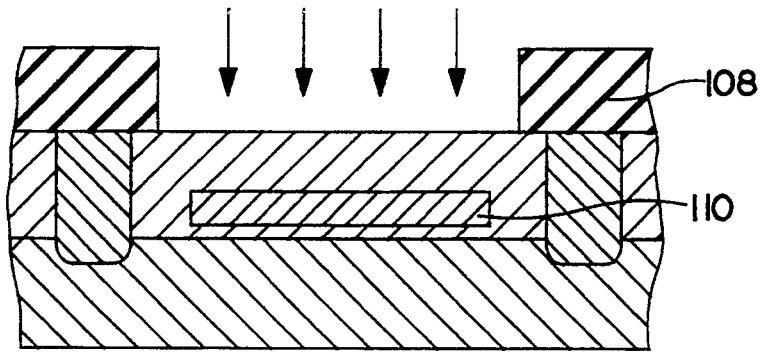
Figure 11C:
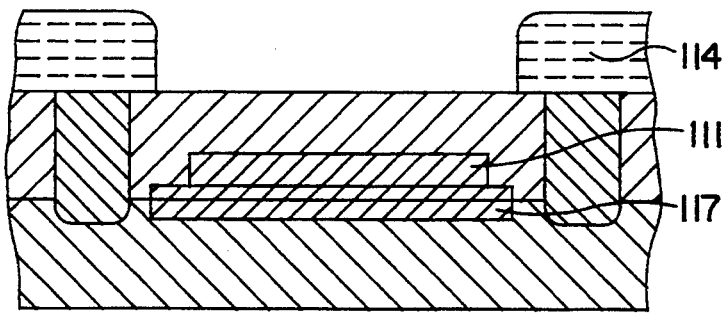
Figure 11D:
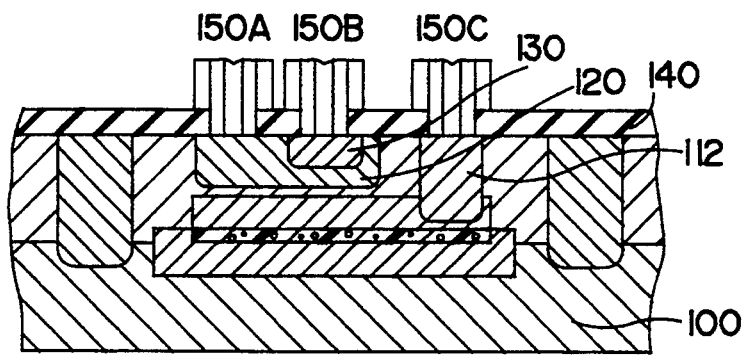

In FIG. 10(c), after forming a second dopant layer having the point of peak concentration within the dopant profile's tail in the first N-type dopant layer 110 via a second high energy arsenic ion implantation of $8 \times 10^{13}$ cm$^{-2}$ with roughly the same acceleration as the first high energy ion implantation, a second annealing with the same annealing conditions as the first annealing was carried out; further, a third high energy ion implantation and annealings were conducted within the tail of the dopant profile of the united first and second implantations, and, these processes were conducted two more times for a total of five implantations to form a united main dopant layer 111. The total arsenic doping of this main dopant layer 111 became $4 \times 10^{14}$ cm$^{-2}$ and the sheet resistance obtained for this dopant layer 111 was a low value of 100–200 Ohm/Square. By forming a junction of the well shaped N-type semiconductor region 102 and the dopant layer 111, a well shaped semiconductor region (formed by the well shaped semiconductor region 102 and dopant layer 111) having a buried region with a resistance more than one order of magnitude lower than the sheet resistance of the well shaped semiconductor region 102 itself was formed. Further, as shown in the figure, after selectively forming the N-type semiconductor region, which will become a diffusion region for extracting the collector, and after forming the trench portion for isolating elements by penetrating through the dopant layer 111 from the surface of the semiconductor substrate, a silicon oxide film 113 was remained within this trench to become the element isolation material. Also, for element separators, various usual materials such as the often used polysilicon and BPSG films can be used.

In FIG. 10(*d*), usual fabrication methods were used to selectively form P-type semiconductor region 120 as a base approximately 350 nanometer deep, then by ion implantation of arsenic and annealing at approximately 900° C. for 30 minutes a N-type semiconductor region 130, which will become an emitter approximately 200 nanometer deep was formed; then aluminum electrodes 150A, 150B and 150C, extracted from openings of the dielectric silicon oxide film 140, were formed for the base, emitter and collector, respectively.

By the method of the subject invention in this manner, within the profile of the main dopant layer formed by a plurality of high energy ion implantation and annealing to obtain a desired dopant concentration, the occurrence of secondary defects was suppressed and a main dopant layer 111 which would become an excellent buried region for the collector was formed. In this case, since the dosage of the first high energy ion implantation into the silicon monocrystalline semiconductor substrate was set at $1 \times 10^{14}$ cm$^{-2}$ or less, even though in the vicinity of the point of peak dopant concentration located roughly in the center of the implanted dopant layer there existed a region of grouped crystal deformation caused by implantation damage, by re-crystallization from the post-implantation annealing the crystallinity was restored, and, due to diffusion of dopant from annealing the dopant concentration at the point of dopant peak concentration was reduced. Even if another high energy ion implantation with dosage of $1 \times 10^{14}$ cm$^{-2}$ or less followed by annealing was done to the region where crystallinity was so restored and the dopant concentration at the point of peak concentration was lowered a little, no occurrence of crystal defects was seen within the main dopant layer's profile. As in the prior art method, when a single high energy ion implantation with a total dosage greater than $1 \times 10^{14}$ cm$^{-2}$ was used to form a buried dopant layer unrestorable secondary defects occurred; but the implementation, as in the method of the subject invention, of a fabrication method using repeated implantation and annealing permits the satisfactory formation of a main dopant layer which becomes a low resistance buried region containing a total amount of dopant sufficiently greater than $1 \times 10^{14}$ cm$^{-2}$, while suppressing crystal defects.

Also, in the embodiment of the subject invention, instead of the epitaxial layer used in the usual method of fabricating bipolar transistors, a well shaped N-type semiconductor region 102 formed by unselective ion implantation and diffusion was used so that reduction of manufacturing cost was achieved. Moreover, it is possible to form coexisting field effect transistors such as PMOS within the well shaped N-type semiconductor region 102. In order to form CMOS in coexistence, by continuously forming the well shaped N-type semiconductor region 102 only in those portions where bipolar elements and their element isolations are to be formed and where PMOS are to be formed; and, by forming a buried main dopant layer over the entire plane of a specified depth within a P-type semiconductor substrate, NMOS can be formed in that portion where well shaped N-type semiconductor region 102 was not formed. In this case, high energy ion implantation has an advantage in that mask patterns need not be used and formation of buried layers can be done unselectively.

While in the subject embodiment the main dopant layer 111 was formed by a total of five ion implantations and annealings, but as long as a dopant profile roughly the same as that of this main dopant layer is formed the order of high energy ion implantations may be changed.

Embodiment 6

FIGS. 11(*a*)–(*d*) will be used to explain the second embodiment where the method of the subject invention was applied to the method of fabricating bipolar vertical NPN transistors.

In FIG. 11(*a*), after forming an N-type semiconductor region 104 having a resistivity of 1 Ohm cm by epitaxial growth above the P-type monocrystalline silicon semiconductor substrate 100, a P-type semiconductor region 104 to be used for element isolation was formed selectively.

In FIG. 11(*b*), after forming a silicon oxide film pattern 108 approximately 1.5 nm thick which will become a mask for high energy ion implantation, a first ion implantation of $8 \times 10^{13}$ cm$^{-2}$ of arsenic with a high acceleration energy of approximately 2 MeV was conducted to form in the bottom part of N-type semiconductor region 104 a buried region which will become an N-type dopant layer 110; then, a first annealing at approximately 1000° C. for 50 minutes was conducted to form, as shown in the figure, a first N-type dopant layer 110.

In FIG. 11(*c*), after forming a second dopant layer having a point of peak concentration within the tail of the first N-type dopant layer 110's dopant profile, through a second high energy ion implantation of $8 \times 10^{13}$ cm$^{-2}$ of arsenic with acceleration energy roughly the same as for the first high energy ion implantation, a second annealing was undertaken with the same conditions as the first annealing; then, by repeating similar implantation and annealing for a total of five times, a united main dopant layer 111 was formed. In these five implantations the method related in Embodiment 5 was used. The total arsenic dopant in the main dopant layer 111 came to $4 \times 10^{14}$ cm$^{-2}$ and a low sheet resistance value of 100–200 Ohm/Square was obtained for this dopant layer 111. Here, after removing the silicon oxide film 108, used as a mask for ion implantation, as shown in the figure, using the resist pattern 114 as a mask having an opening of a shape including the main dopant layer 111 in a plane, $5 \times 10^{13}$ cm$^{-2}$ of arsenic was ion implanted with a high acceleration energy of 2.5–3.5 MeV to form at the bottom of N-type semiconductor region 110, a buried region which will become a N-type dopant layer 117, annealing at approximately 1000° C. for 50 minutes, and, as shown in the figure, formed the N-type separate dopant layer 117 having a dopant profile's tail overlapping the lower tail of the N-type dopant layer 111's dopant profile. No occurrence of secondary defects was seen within this additional N-type dopant layer 117.

In FIG. 11(*d*), usual fabrication methods were used to selectively form N-type semiconductor region 112 to become the diffusion region for extracting the collector and P-type semiconductor region 120 to become the base; then, after ion implantation of arsenic and annealing at approximately 900° C. for 30 minutes to form an N-type semiconductor region 130 which will become the emitter, aluminum electrodes 150A, 150B and 150C to be used for the base, emitter and collector, respectively, were extracted from the openings of the dielectric silicon oxide film 140.

In such a manner in accordance with the method of the subject invention, by forming a additional dopant layer 117 through high energy ion implantation adjoining the lower portion of the main dopant layer 111, it was possible form an N-type buried collector region which reduces the resistance of the collector region. Ordinarily, the element isolation between a P-type semiconductor substrate and an N-type buried region is done by reverse biasing. In this case, the formation of the additional dopant layer 117 in accordance with the subject invention between the P-type semiconductor substrate 110 and the N-type buried main dopant layer 111 was effective in preventing the effects of crystal defects arising from the main dopant layer 111. Speaking in more detail, after conducting a additional introduction of a dopant having the same conductivity as the previously noted dopant, and having its peak dopant concentration to the outside of the lower tail of this main dopant layer's dopant profile, followed by annealing to form a separate lower dopant layer, and, by forming a united dopant layer by overlapping the upper tail of this additional dopant layer's profile and the said united main dopant layer's lower tail, the crystal defects from the united main dopant layer 111 were surrounded by this additional dopant layer 117. Since element isolation is accomplished by reverse biasing between the additional dopant layer, which will become the collector, and the P-type semiconductor substrate, the extension of the depletion layer from the semiconductor substrate side was blocked by the crystal defect-free additional dopant layer and abnormal leak current in the element isolation portion was prevented.

Even when the method of the subject invention is applied to CMOS, for example, below an N-type well region formed within a P-type semiconductor substrate, high energy ion implantation is used to form an N-type low resistance buried region which will become a main dopant layer. The formation of an additional dopant layer in accordance with the subject invention, between the P-type semiconductor substrate and the N-type buried region, is effective in preventing the effects of such as occurrence of leak current due to crystal defects arising from the main dopant layer.

While at a specified depth within a semiconductor substrate a first buried dopant layer 110 was formed after a first introduction of a dopant through selective high energy ion implantation followed by a first annealing, there is no requirement that the energy used in a second high energy ion implantation be the same value as that of the first implantation. It is also acceptable to switch the dopant element of the first and second implantation between arsenic and phosphorus.

As shown in the embodiment of the subject invention, by forming an additional dopant layer 117 to surround the bottom portion of the main dopant layer 111, there is improvement in blocking the extension of the depletion layer from the semiconductor substrate 100. Similar improvement can also be considered for the P-type semiconductor region 106 for element isolation. That is, as an example of why an additional dopant layer should be formed at a roughly the same depth as the main dopant layer 111 horizontally in the peripheral portions (front, back, left and right), there is the following case. Usually, element isolation between the N-type buried region and the element isolation region 106 is done by reverse biasing. At this time, the formation of a planar separate dopant layer (shallower than the dopant layer shown in the figure and at a depth roughly the same as the main dopant layer 111) between the P-type element isolation region and the N-type main dopant layer 111 is effective for suppressing effects such as occurrence of leak current due to crystal defects arising from the main dopant layer. In this case, it is desirable that the planar additional dopant layer be formed in a form to surround secondary defects within the main dopant layer 111 and secondary defects extending from this dopant layer 111.

Embodiment 7

FIGS. 12(a)–(d) will be used to explain the third embodiment where the method of the subject invention was applied to the method of fabricating bipolar vertical NPN transistors.

Figure 12A:
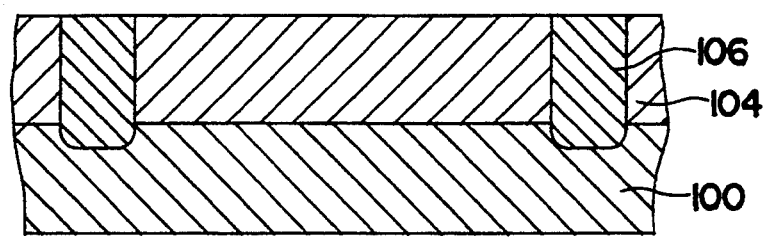

In FIG. 12(a), after forming an N-type semiconductor region 104 having resistivity of 1 Ohm cm by epitaxial growth above a P-type monocrystalline silicon semiconductor substrate 100, a P-type semiconductor region 106 was selectively formed for the purpose of element isolation.

Figure 12B:
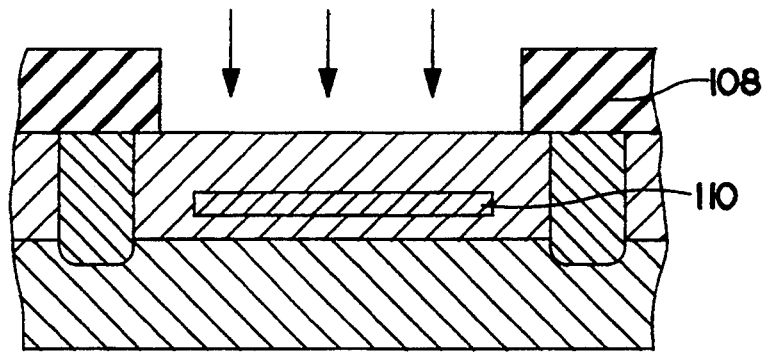

In FIG. 12(b), after forming a silicon oxide pattern 108 having a thickness of approximately 1.5 nm to be a mask for high energy ion implantation, a first ion implantation of $8 \times 10^{13}$ cm$^{-2}$ of arsenic was conducted with a high energy of approximately 1.0 MeV to form a buried region which will become the N-type dopant layer 110 within the lower portion of the N-type semiconductor region 104, then annealed by a first annealing at approximately 1000° C. for 5 minutes to form a first N-type dopant layer 110 as shown in the figure.

Figure 12C:
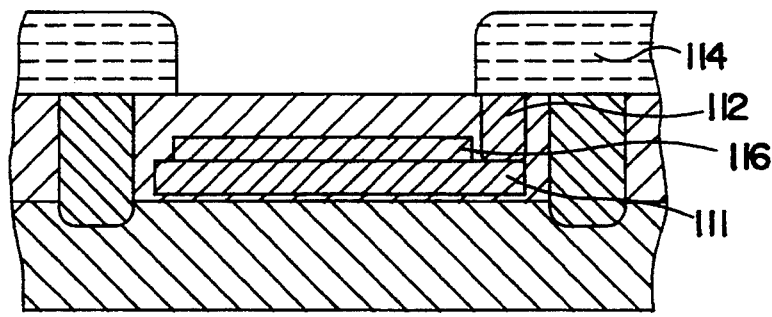

In FIG. 12(c), after forming a second dopant layer having the point of peak dopant concentration within the first N-type dopant layer 100's dopant profile by a second high energy ion implantation of arsenic, of $8 \times 10^{13}$ cm$^{-2}$ using roughly the same acceleration energy as the first high energy ion implantation, followed by a second annealing with the same conditions as for the first annealing; furthermore, similar implantations and annealings were repeated for a total of five times to form a united main dopant layer 111. The total amount of arsenic dopant of this main dopant layer 111 came to $4 \times 10^{14}$ cm$^{-2}$ and a low sheet resistance of 100–200 Ohm/Square was obtained for this dopant layer 111. Here, after removing the silicon oxide film 108 which was used as a mask for ion implantation, as shown in the figure, using as a mask the resist pattern 114 of the dopant layer 110, $5 \times 10^{13}$ cm$^{-2}$ of arsenic was implanted using high energy ion implantation with acceleration energy of 1–1.3 MeV to form a buried region, which will become an N-type dopant layer 116, above the N-type dopant region 111, and annealed at approximately 1000° C. for 50 minutes, as shown in the figure, forming an additional N-type dopant layer 116 having a dopant profile's tail which overlapped the upper tail of the N-type dopant layer 111's dopant profile. No occurrence of secondary defects were noted within this N-type additional dopant layer 116.

Figure 12D:
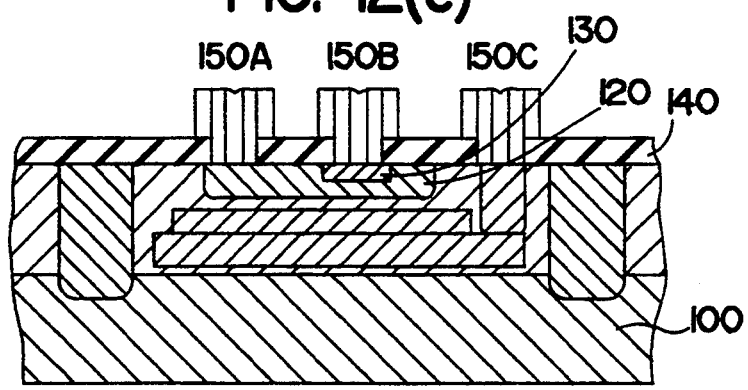

In FIG. 12(d), in accordance with usual fabrication methods, an N-type semiconductor region 112, which will become the diffusion region for collector extraction, and a P-type semiconductor region 120, which will become the base, were formed selectively and after arsenic ion implantation and annealing at approximately 900° C. for 30 minutes to form an N-type semiconductor region which will become the emitter, aluminum electrodes 150A, 150B and 150C, respectively, for the base, emitter and collector, extracted from openings in the dielectric silicon oxide film 140, were formed.

Thusly, in accordance with the method of the subject invention, by forming an additional dopant layer 116 adjacent to the upper portion of the main dopant layer 111 by high energy ion implantation, it is possible to form an N-type buried collector region having low resistance.

Also, since reduction in collector resistance contributes to the increase of a transistors speed, the dopant concentration of the dopant layer forming the collector should be as high as possible, within a range which will not degrade the collector breakdown voltage, and, in order to reduce the resistance between the collector and the base, the distance between the additional dopant layer 116 which will become the buried collector region and the P-type semiconductor region 120 which will become the base should be as small as possible. By forming an additional semiconductor layer 116 in accordance with the subject invention between the base region 120 and the N-type buried collector region (main dopant layer 111), the effects of crystal defects arising from the main dopant layer are suppressed. That is, since the transistor is operated with reverse biasing between the collector and the base, this additional dopant layer was able to block the extension of the depletion layer from the base and abnormal leak current from the junction was reduced.

As explained above, in accordance with the subject invention, in the introduction of dopant deep into a substrate using high energy ion implantation, by setting the ion dosage of a single ion implantation to $1 \times 10^{14}$ cm$^{-2}$ or less and by repeating implantation and annealing, the implantation damage caused by a single ion implantation is completely restored by each post-implantation annealing. Because of this the implantation secondary defect density is low, and it is possible to obtain high concentration dopant layers, so that practical effects are large.

What is claimed:

1. A method of fabricating a semiconductor device comprising the steps of:
   forming, at a depth and a spacing within a monocrystalline semiconductor substrate, a plurality of dopant regions by selective high energy ion implantation at an energy level and a dosage of not greater than $1 \times 10^{14}$ cm$^{-2}$, of a dopant selected from the group consisting of phosphorous, arsenic and boron, and
   annealing said semiconductor substrate after each one of said plurality of dopant regions is formed,
   wherein said plurality of selective ion implantations at the depth, the energy level and the spacing and annealings are conducted to obtain a respective desired dopant concentration for each one of said plurality of dopant regions.

2. A method of fabricating a semiconductor device comprising the steps of:
   forming a first buried dopant layer of a dopant selected from the group consisting of phosphorous, arsenic and boron, within a monocrystalline semiconductor substrate, by a first selective high energy ion implantation of a first dopant having a conductivity at an energy level and a dosage of not greater than $1 \times 10^{14}$ cm$^{-2}$ followed by a first annealing, said first buried dopant layer having a dopant profile with a dopant profile tail, said tail having an inside region;
   forming a second dopant layer at said energy level and a second dosage of not greater than $1 \times 10^{14}$ cm$^{-2}$ having a desired peak dopant concentration inside of said first buried dopant layer profile's tail by selective high energy ion implantation of a second dopant having conductivity substantially equal to said first dopant, of a dopant selected from the group consisting of phosphorous, arsenic and boron;
   performing a second annealing,
   forming a dopant layer uniting said first and second buried dopants, of a dopant selected from the group consisting of phosphorous, arsenic and boron;
   repeating a plurality of times a process similar to said second introduction of dopant and the second annealing in the same tail as the second dopant to form a united main dopant layer having a desired dopant concentration; and
   using the semiconductor region formed by the united main dopant layer as a low resistance buried region.

3. A method of fabricating a semiconductor device comprising the steps of:
   forming a first buried dopant layer of a dopant selected from the group consisting of phosphorous, arsenic and boron, within a monocrystalline semiconductor substrate, by a first selective high energy ion implantation of a first dopant having a conductivity at an energy level and a dosage of not greater than $1 \times 10^{14}$ cm$^{-2}$ followed by a first annealing, said first buried dopant layer having a dopant profile with a dopant profile tail, said tail having an inside region;
   forming a second dopant layer having a desired peak dopant concentration to the inside of said first buried dopant layer profile's tail by selective high energy ion implantation of a second dopant at said energy level and a second dosage of not greater than $1 \times 10^{14}$ cm$^{-2}$ having the same conductivity as said first dopant and a second annealing, of a dopant selected from the group consisting of phosphorous, arsenic and boron;
   forming a dopant layer uniting said first and second buried dopants, of a dopant selected from the group consisting of phosphorous, arsenic and boron;
   repeating a plurality of times a process similar to said second introduction of dopant and the second annealing in the same tail as the second dopant to form a united main dopant layer having a desired dopant concentration, said united main dopant layer having an outside region;
   forming a lower additional dopant layer having a desired peak dopant concentration outside of said united main dopant layer profile's lower tail by additional introduction of a dopant having conductivity substantially equal to said desired dopant concentration, of a dopant selected from the group consisting of phosphorous, arsenic and boron;
   performing an annealing;
   forming a further united dopant layer by overlapping the upper tail of said additional dopant layer's profile and said united main dopant layer's lower tail; and using the further united dopant layer as a low resistance buried region.

4. A method of fabricating a semiconductor device comprising the steps of:

forming a first buried dopant layer of a dopant selected from the group consisting of phosphorous, arsenic and boron, within a monocrystalline semiconductor substrate, by a first selective high energy ion implantation of a first dopant having a conductivity at an energy level and a dosage of not greater than $1 \times 10^{14}$ cm$^{-2}$ followed by performing a first annealing, said first buried dopant layer having a dopant profile with a dopant profile tail, said tail having an inside region;

forming a second dopant layer at said energy level and a second dosage of not greater than $1 \times 10^{14}$ cm$^{-2}$ having a desired peak dopant concentration inside of said first buried dopant layer profile's tail by selective high energy ion implantation of a second dopant having conductivity substantially equal to said first dopant, of a dopant selected from the group consisting of phosphorous, arsenic and boron;

performing a second annealing;

forming a dopant layer uniting said first and second buried dopants, of a dopant selected from the group consisting of phosphorous, arsenic and boron;

repeating a plurality of times a process similar to said second introduction of dopant and the second annealing in the same tail as the second dopant to form a united main dopant layer having a desired dopant concentration, said united main dopant layer having an outside region;

forming an upper additional dopant layer having a desired peak dopant concentration outside of said united dopant layer profile's upper tail by introduction of an additional dopant having conductivity substantially equal to said desired dopant concentration, of a dopant selected from the group consisting of phosphorous, arsenic and boron;

performing a further annealing;

forming a united dopant layer by overlapping the lower tail of said upper additional dopant layer's profile and said united main dopant layer's upper tail; and using the dopant layer united by overlapping the tails as a low resistance buried region.

5. A method of fabricating a semiconductor device comprising the steps of:

forming a first buried dopant layer of a dopant selected from the group consisting of phosphorous, arsenic and boron, within a monocrystalline semiconductor substrate, by a first selective high energy ion implantation of a first dopant having a conductivity at an energy level and a dosage of not greater than $1 \times 10^{14}$ cm$^{-2}$ followed by performing a first annealing, said first burled dopant layer having a dopant profile with a first dopant profile tail, said first dopant profile tail having an inside region;

forming a second dopant layer at said energy level and a second dosage of not greater than $1 \times 10^{14}$ cm$^{-2}$ having a desired peak dopant concentration inside of said first dopant profile tail by selective high energy ion implantation of a second dopant having conductivity substantially equal to said first dopant, of a dopant selected from the group consisting of phosphorous, arsenic and boron;

performing a second annealing;

forming a dopant layer uniting said first and second buried dopants, of a dopant selected from the group consisting of phosphorous, arsenic and boron;

repeating a plurality of times a process similar to said second introduction of dopant and the second annealing in said first profile tail to form a united main dopant layer having a desired dopant concentration, said united main dopant layer having an outside region, an united dopant layer profile tail and at least one crystal defect;

forming an additional dopant layer having a desired peak dopant concentration outside of the plane of said united dopant layer profile tail by introduction of an additional dopant having the same conductivity as said dopant, of a dopant selected from the group consisting of phosphorous, arsenic and boron;

performing a further annealing; and forming a united dopant layer by surrounding said united dopant layer profile tail by said additional dopant layer and further using said additional dopant layer for surrounding the crystal defect from the united main dopant layer, and using said united main dopant layer as a low resistance buried region.

6. A method of fabricating a semiconductor device as claimed in any of claims 1 through 5, wherein monocrystalline silicon is used as the semiconductor substrate.

7. A method of fabricating a semiconductor device as claimed in claim 6, wherein an aggregate dosage of said plurality Of single high, energy ion implantations is greater than $1 \times 10^{14}$ cm$^{-2}$.

8. A method of fabricating a semiconductor device as claimed in claim 7, wherein oxygen concentration within the substrate at depths shallower than a predetermined depth is reduced prior to repeating a plurality of ion implantations and annealings.

9. A method of fabricating a semiconductor device as claimed in any of claims 2 through 5, wherein the conductivity of the semiconductor substrate located below the main dopant layer has the opposite conductivity from the dopant of the high energy ion implantation.

10. A method of fabricating a semiconductor device claimed in any of claims 2 through 5, wherein the conductivity of the epitaxial semiconductor substrate positioned adjacent to the upper portion of the main dopant layer is of the same conductivity as that of the dopant of the high energy ion implantation.

11. A method of fabricating a semiconductor device claimed in any of claims 2 through 5, wherein the conductivity of a well-shaped diffused semiconductor substrate positioned adjacent to the upper portion of main dopant layer is of the same conductivity as that of the dopant of the high energy ion implantation.

* * * * *

UNITED STATES PATENT AND TRADEMARK OFFICE
CERTIFICATE OF CORRECTION

PATENT NO.    : 5,436,176
DATED         : July 25, 1995
INVENTOR(S)   : Norisato Shimizu et al.

It is certified that error appears in the above-identified patent and that said Letters Patent is hereby corrected as shown below:

Column 19, line 60, claim 5, before "dopant" change "burled" to --buried--.

Column 20, line 40, claim 7, after "plurality" change "Of" to --of--.

Signed and Sealed this

Second Day of January, 1996

*Attest:*

BRUCE LEHMAN

*Attesting Officer*      *Commissioner of Patents and Trademarks*